United States Patent [19]

Lay

[11] Patent Number: 5,401,717
[45] Date of Patent: Mar. 28, 1995

[54] ELONGATE BISMUTH SYSTEM SUPERCONDUCTOR HAVING ALIGNED 2212 PHASE

[75] Inventor: Kenneth W. Lay, Schenectady, N.Y.

[73] Assignee: General Electric Company, Schenectady, N.Y.

[21] Appl. No.: 194,980

[22] Filed: Feb. 14, 1994

Related U.S. Application Data

[63] Continuation of Ser. No. 952,234, Sep. 28, 1992, abandoned.

[51] Int. Cl.$^6$ .................. H01L 39/24; H01B 12/04
[52] U.S. Cl. .................. 505/433; 505/430; 505/704; 505/742; 505/782; 427/62; 29/599; 174/125.1
[58] Field of Search .......... 505/1, 704, 742, 782, 505/430, 433; 427/62, 63; 29/599; 174/125.1

[56] References Cited

U.S. PATENT DOCUMENTS

| | | |
|---|---|---|
| 4,906,609 | 3/1990 | Yamauchi et al. |
| 4,973,575 | 11/1990 | Capone . |
| 4,980,964 | 1/1991 | Boeke . |
| 5,026,680 | 6/1991 | Sugihara et al. ............ 505/1 |
| 5,057,488 | 10/1991 | Arendt et al. ............... 505/1 |

FOREIGN PATENT DOCUMENTS 0357779 12/1988 European Pat. Off. .

OTHER PUBLICATIONS

Wai Lo and B. A. Glowacki, A Study of the Formation Processes of the 2212 Phase in the Bi-based Superconductor Systems, Physica C 193 (1992) pp. 253–263.

S. X. Dou, H. K. Liu, M. H. Apperley, K. H. Song and C. C. Sorrell, Critical Current Density in Superconducting Bi-Pb-Sr-Ca-Cu-O Wires and Coils, Supercond. Sci. Technol 3 (1990) pp. 138–142.

Yamada et al, "Properties of Ag-Sheathed Bi-Pb-Sr-Ca-Cu-O Superconducting Tapes Prepared by the Intermediate Pressing Process", Jpn. J. Appl. Phys. vol. 29, No. 3, Mar. 1990, pp. L456-L458.

*Primary Examiner*—Roy V. King
*Attorney, Agent, or Firm*—James Magee, Jr.

[57] ABSTRACT

This invention is related to the preparation of an elongate conductor having a silver sheath, and a core of an aligned polycrystalline oxide superconductor having the approximate formula $Bi_{2-x}Pb_xSr_{2-a}L_{a+b}Ca_{1-b}Cu_2O_y$ where y is from 7.5 to 8.5, and L is a lanthanide. A powder mixture is formed comprised of a first portion of a superconducting bismuth oxide compound that can be reaction-sintered to form the core oxide superconductor, and a second portion of oxides suitable for reacting with the first portion to form the core oxide superconductor. An elongate body is formed having a silver sheath, and a core of the mixture. The body is deformed to align the first portion, and heated to reaction-sinter the first and second portions to form the core oxide superconductor.

2 Claims, 1 Drawing Sheet

ELONGATE BISMUTH SYSTEM SUPERCONDUCTOR HAVING ALIGNED 2212 PHASE

This invention was made with Government support under Contract No. N00014-88-C-0681 awarded by the Department of the Navy. The Government has certain rights in the invention.

This application is a continuation of application Ser. No. 07/952,234, filed Sep. 28, 1992, now abandoned.

This invention is related to an elongate superconductor body. More specifically to an elongate body having a core of an aligned polycrystalline superconductor having the approximate formula $Bi_{2-x}Pb_xSr_{2-a}La_{a+b}Ca_{1-b}Cu_2O_y$ in a silver sheath.

BACKGROUND OF THE INVENTION

Superconductivity is that characteristic of certain materials which permits them to conduct electric currents without resistance. A superconducting material exhibits this characteristic only when its temperature is below the superconducting critical temperature of the material, and then only if it is not subject either to a magnetic field greater than the superconducting critical magnetic field of the material or to an electric current density greater than the superconducting critical current density of the material. Accordingly, superconductivity can be quenched, i.e., returned to a resistive state, by increasing the temperature, magnetic field, or current density to which the superconducting material is subjected above the critical temperature, magnetic field, or current density of the superconducting material.

The discovery of a new superconductor comprised of oxides of lanthanum, barium, and copper by J. G. Bednorz et al., "Possible High-$T_c$ Superconductivity in the Ba—La—Cu—O System," Z. Phys. V. 64, pg. 189, 1987, led to the discovery of a series of superconducting oxide compounds having a high critical temperature above 30 K. For example, a bismuth system of oxide compounds, containing oxides of one or two gram atoms of bismuth, one or two gram atoms of calcium, one or two gram atoms of strontium, and one, two or three gram atoms of copper, have a critical temperature above 7 K., and are herein referred to as bismuth superconductor oxide compounds.

The oxide superconductors, for example the oxide compound of bismuth, strontium, calcium, and copper in the ratio of about 2: 2: 2: 3, respectively, can be shown by a formula, $Bi_2Sr_2Ca_2Cu_3O_{10+y}$. The cation ratios given in such formulas usually indicate the ideal structure, and the exact oxygen content per molecular unit is nominal so that y varies within about a fraction of one. In addition, there may be substitution of cations on other sites, cation vacancies, or oxygen interstitials present so that the actual superconducting phase is not exactly that given by the ideal formula.

The discovery of the oxide superconductors enables the development of superconducting equipment operating at temperatures up to liquid nitrogen cooling, about 77 K., instead of liquid helium cooling, about 4.2 K. Among the applications for such oxide superconductors are power transmission lines, rotating machinery, and superconducting magnets, e.g. for fusion generators, particle accelerators, levitated vehicles, magnetic separation, energy storage, and magnetic resonance imaging. These devices require the development of elongated conductors, e.g., wire or tape of the oxide superconductors.

However, to be of practical value an oxide superconductor must be able to carry or conduct a substantial current, at least approaching the current-carrying capacity of alloy superconductors such as $Nb_3Sn$. The high current-carrying capacity must be evident at temperatures up to the critical temperature without quenching or loss of superconductivity as evidenced by a substantial increase in electrical resistance.

It is known that the oxide superconductors have an orthorhombic crystal form that exhibits anisotropy in the critical current density. The a- and b- directions within the basal plane of the orthorhombic crystal are capable of supporting on the order of 30 to 100 times the critical current density which can be achieved in the c-direction normal to the basal plane. As a result, one approach to improving the critical current density of a polycrystalline oxide superconductor is to form a single phase powder of the oxide superconductor, and align the powder through some mechanical working operation such as extrusion, wire drawing or rolling.

For example, U.S. Pat. No. 4,973,575, discloses a method of orienting the crystalline axes of different grains in oxide superconducting materials along the basal plane to facilitate current transport across the grain boundaries. A single crystal powder is formed by grinding into fine powders either bulk single crystals, or a powder formed by long term annealing of powder samples of the polycrystalline oxide material at temperatures near the melting temperature to promote large single crystal grain growth. In grinding the superconducting crystals to a size less than the original grain size, the compact superconducting metal oxide material is cleaved along the crystal axes resulting in platelets, having a disc-like shape. The axes of the platelets having a high critical current density lie in the plane of the disc-like shape. Conventional mechanical working techniques, such as extrusion, tape casting or slip casting are used to align the superconducting particles and increase the critical current density of the polycrystalline oxide superconductor body sintered therefrom.

In another method of forming aligned polycrystalline oxide superconductors, European patent application 357,779 discloses a metal tube is filled with a powder of an oxide superconductor having a perovskite structure. The tube is reduced, for example by rolling by more than 30 percent, to form a compressed oriented layer of the powder oriented so the c-axial direction is perpendicular to the longitudinal direction of the conductor. The reduced tube is heated to sinter the oxide superconductor powder.

One aspect of this invention is a method for forming an aligned polycrystalline $Bi_2Sr_2CaCu_2O_{8+y}$ oxide superconductor core, within a normal metal sheath.

Another aspect of this invention is a composite elongated conductor having a normal metal sheath, and an oxide superconductor core having an aligned polycrystalline core of $Bi_2Sr_2CaCu_2O_{8+y}$.

In the oxide superconductor having the approximate formula $Bi_2Sr_2CaCu_2O_{8+y}$, it is known that lead can be partially substituted for bismuth, and the lanthanides can be partially substituted for strontium or calcium. As used herein, the term "lanthanide" means the elements having an atomic number from 57 to 71 in the periodic table, and yttrium. Therefore, the $Bi_2Sr_2CaCu_2O_{8+y}$ oxide superconductor can be shown by the approximate formula $Bi_{2-x}Pb_xSr_{2-a}La_{a+b}Ca_{1-b}Cu_2O_y$ where y is from 7.5 to 8.5, and L is a lanthanide, and is sometimes herein referred to as the "2212 compound".

BRIEF DESCRIPTION OF THE INVENTION

I have found that an aligned polycrystalline superconductor having the approximate formula $Bi_{2-x}Pb_xSr_{2-a}L_{a+b}Ca_{1-b}Cu_2O_y$ can be formed from an aligned precursor powder that can be reaction-sintered to form the superconducting oxide compound, and form conducting links between grains while maintaining the desired crystal orientation.

A composite elongate conductor having a silver sheath and a core of the oxide superconductor having the approximate formula $Bi_{2-x}Pb_xSr_{2-a}L_{a+b}Ca_{1-b}Cu_2O_y$ where y is from 7.5 to 8.5, and L is a lanthanide is formed by forming a powder mixture comprised of a first portion of a superconducting bismuth oxide compound that can be reaction-sintered to form the core oxide superconductor, and a second portion of oxides suitable for reacting with the first portion to form the core oxide superconductor. An elongate body is formed having a silver sheath, and a core of the mixture. The body is deformed to align the first portion, and heated to reaction-sinter the first and second portions to form the core oxide superconductor.

The elongated composite conductor comprises a silver sheath, and a core of a polycrystalline oxide superconductor having the approximate formula $Bi_{2-x}Pb_xSr_{2-a}L_{a+b}Ca_{1-b}Cu_2O_y$ where y is from 7.5 to 8.5, and L is a lanthanide. The polycrystalline core having an anisotropic crystal structure oriented to provide improved flow of electric current along the length of the body.

DETAILED DESCRIPTION OF THE INVENTION

Figure 1:
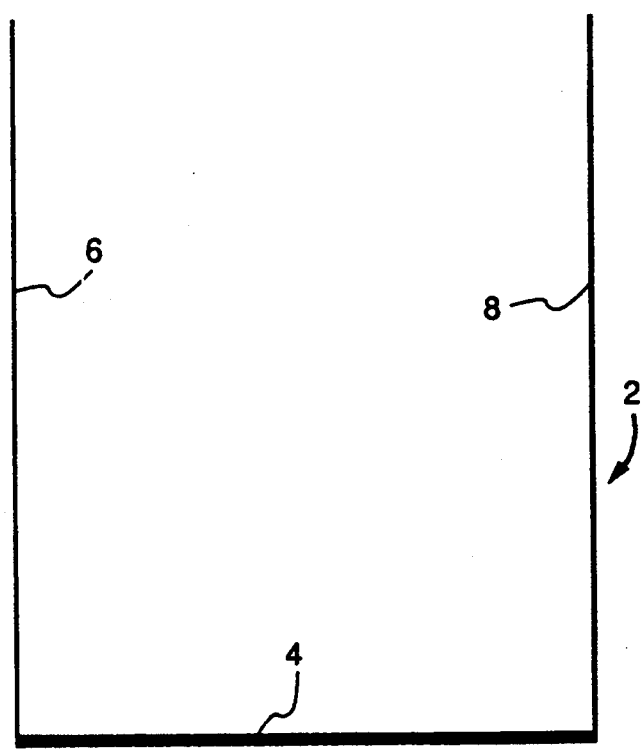
FIG. 1 is a cross-sectional view of a silver foil formed to receive a deposit.

The silver sheath can be formed from pure silver, or silver alloy's that do not react with the oxide superconductor core.

The core oxide superconductor in the elongate composite conductor of this invention is formed by reaction-sintering a powder mixture of first and second portions of oxides suitable for forming the 2212 compound. The first portion is a powder of a superconducting bismuth oxide compound that can be reaction-sintered to form the 2212 compound. The first portion is at least comprised of about 10 volume percent of a first superconducting bismuth oxide compound, sometimes herein referred to as the "2201 compound,"0 and the balance is the 2212 compound. The 2201 compound is comprised of about two gram atoms of bismuth, about two gram atoms of strontium, and about one gram atom of copper. Up to about 25 atom percent lead can be partially substituted for bismuth, up to about 50 atom percent calcium can be partially substituted for strontium, and about 30 atom percent of a lanthanide can be partially substituted for either calcium or strontium in the 2201 compound. Therefore, the 2201 compound can be shown by the approximate formula $Bi_{2-x}Pb_xSr_{2-(a+b)}L_aCa_bCuO_y$ where y is from 6.5 to 7.5, and L is a lanthanide. Preferably, the first portion is comprised of at least about 10 volume percent of the 2201 compound, and most preferably is 100 volume percent of the 2201 compound.

The second portion of the powder mixture is comprised of the oxides that are needed to react with the first portion to form the core of the 2212 compound. In other words, the second portion is a mixture of oxides, or an oxide compound in an amount that can react with the amount of 2201 compound in the first portion to form the 2212 compound. For example, a first portion comprised entirely of the 2201 compound can be mixed with a second portion comprised of oxides of about one gram atom of calcium, and one gram atom of copper. As in the first portion, strontium and lanthanides can be partially substituted for calcium, and the second portion can be shown by the approximate formula $Ca_{1-(a+b)}Sr_aL_bCuO_y$ where y is from about 2 to 2.5, and L is a lanthanide.

The first and second portions can be formed from oxides of the constituent elements, oxide compounds of the elements, or by decomposition of inorganic precursors of the oxides or oxide compounds. For example, useful inorganic precursors are the carbonates, hydroxides, and nitrates of the oxides. The inorganic precursor should be used in an amount sufficient to produce the respective oxide in the amounts needed to form the superconducting compound. Preferably, the carbonate precursor is used as the source of the alkaline earth oxides, i.e. calcium oxide and strontium oxide. The carbonates are decomposed to the oxides, and the oxides reacted to form the superconducting oxide compound.

The powder mixture can be formed by separately preparing the first and second portions, and mixing them. For example, the first portion can be formed by forming a mixture of powders of the inorganic precursors or oxides of bismuth, strontium, and copper, in a ratio suitable for forming the 2201 compound. If inorganic precursors are used the mixture is first decomposed to form the oxides, and the oxides are heated to react the oxides and form the 2201 compound. A suitable second portion is formed by forming a mixture of powders of the inorganic precursors or oxides of strontium and copper, and heating to form an oxide compound having the approximate formula $CaCuO_2$. The first and second portions are mixed, preferably by milling with zirconia milling media, to form a homogenous mixture with a fine particle size.

Another method of forming the powder mixture of the first and second portions is to form a mixture of powders of the inorganic precursors or oxides of bismuth, strontium, calcium, and copper, in a ratio suitable for forming the 2212 compound. If the inorganic precursors are used the mixture is first decomposed to form the oxides, and the oxides are heated to react a portion of the mixture to form the 2201 compound. The remainder of the mixture is the oxides or oxide compounds that form the second portion. Preferably, the powder mixture is milled to form a fine particle size, and form a homogenous distribution of the first and second portions.

The powder mixture should have a particle size suitable for promoting the reaction-sintering, i.e. ranging from submicron up to about 100 microns. The mixing can be performed by conventional methods which minimize contamination of the mixture from exposure to carbon dioxide, or minimize introduction of undesirable impurities such as water. For example, conventional roller or vibratory ball milling with zirconia or partially stabilized zirconia milling media can be used in forming the mixture. The powder mixture can be wet milled in a medium free of water, alcohols, or carbon dioxide, such as heptane or hexane.

The elongated body, such as a wire or tape, comprised of a core of the powder mixture of first and second portions enclosed in the silver sheath can be formed by conventional methods that provide a hermetically sealed sheath for the core. For example, the elongated body can be formed by the powder in tube method, or by a method described in copending application Ser. No. 07/723,032, filed Jun. 28, 1991, now U.S. Pat. No. 5,192,739, incorporated herein by reference.

In the method of the '032 copending application, a silver foil is formed into a sheath that surrounds an oxide superconductor core. The silver foil has a thickness suitable for supporting the brittle oxide superconductor core. Preferably, the silver foil has sufficient thickness to provide a current shunt for the superconducting core. For example, the silver foil mechanically supports the relatively brittle oxide superconductor core so that the superconducting tape can be fabricated into a long wire or tape and formed, e.g., as windings in a magnet. A suitable silver foil is at least about 0.025 millimeters in thickness, and preferably is about 0.1 to 0.5 millimeters in thickness.

The powder mixture of first and second portions can be poured onto a receiving surface formed in the silver foil to form a precursor core. Other techniques well known in the art can also be used to form the powder mixture into a precursor core. Tape casting and plastic extrusion can be used to form continuous lengths of the powder. Tape casting and plastic extrusion processes use a mixture of the powder mixture and an organic polymer mixture. The powder mixture is mixed with appropriate amounts of a dispersant, a binder, a plasticizer, and a solvent that is compatible with the other constituents of the mix. The cuprate oxide superconductors react with water and therefore, organic solvents are used. The dispersant is a surface-active agent which limits agglomeration of the powder. The binder gives strength to the green body, and the plasticizer lowers the glass-transition temperature of the binder to impart flexibility to the green body. A suitable organic polymer mixture is comprised of polyvinyl butyral resin as the binder and dispersant, diisodecyl gluterate as the plasticizer, and methyl isobutyl ketone and toluene as solvents.

Figure 2:
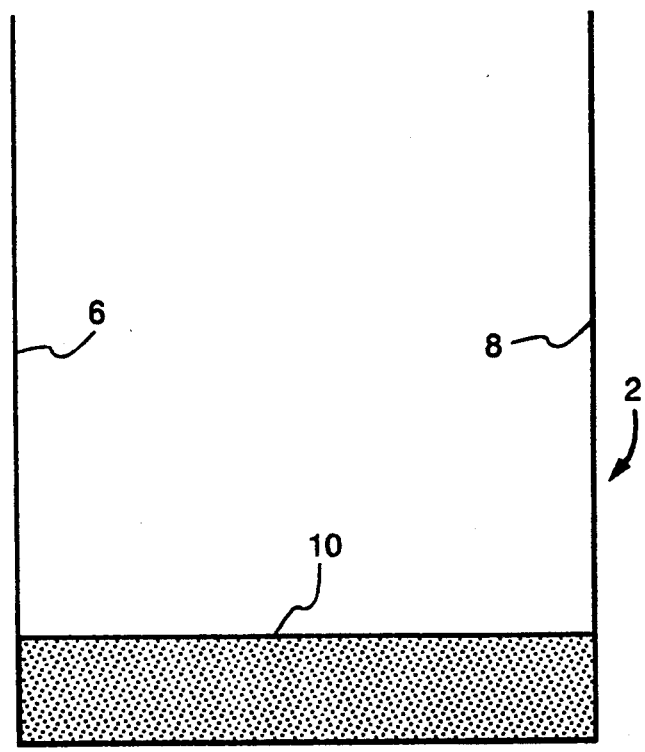
FIG. 2 is a cross-sectional view of the foil in FIG. 1, with a deposit formed thereon.
Figure 3:
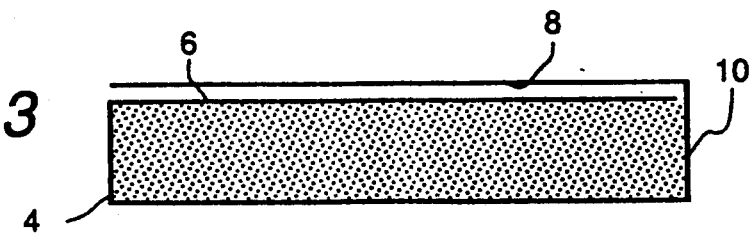
FIG. 3 is a cross-sectional view of the foil in FIG. 2, the foil having been wrapped around the deposit to form a sheath.

The method of the '032 copending application is shown by making reference to FIGS. 1-3. First referring to FIG. 1, a silver foil 2, is formed into a channel having a receiving surface 4, and enclosing surfaces 6 and 8. The combined thickness of enclosing surfaces 6 and 8 is equivalent to the thickness of receiving surface 4. For example, silver foil 2 is formed to have a central width portion having a first thickness of the receiving surface 4, and the outer portions of the foil width are half the thickness of receiving surface 4, i.e., enclosing surfaces 6 and 8. Alternatively, foil 2 has a uniform thickness across the width of the foil, and a second foil having the width of the receiving surface 4 and the same thickness as foil 2, is placed on the receiving surface 4 to form twice the thickness of enclosing surfaces 6 and 8.

Referring to FIG. 2, a precursor core 10 of the powder mixture is formed on receiving surface 4. When precursor core 10 is comprised of an organic polymer mix, a decomposition anneal is performed to decompose the polymer mix. Preferably, binders that decompose at temperatures below about 500° C. are used to minimize warping or deformation of foil 2. A suitable decomposition anneal comprises heating in air to about 500° C. at a rate of about 50° C. per hour to minimize blistering in the deposit. As shown in FIG. 3, enclosing surfaces 6 and 8 are wrapped or folded over precursor core 10, and enclosing surface 8 overlaps enclosing surface 6. The overlapping enclosing surfaces 6 and 8 are sealed, for example, by light rolling.

Alternatively, the elongate body can be formed by the powder in tube method. Briefly described, a silver tube is filled with the reactant oxide powder mixture. The tube is sealed by caps bonded to the ends, and processed in a series of drawing, intermediate anneal, and optional rolling steps. Additional information about processing in the powder in tube method can be found in the disclosure of Matsumoto et al. cited above, or for example, in U.S. Pat. Nos. 4,952,554, and 4,980,964, incorporated herein by reference.

The elongate body is deformed sufficiently to align the basal plane in the grains of the 2201 or 2212 compounds along the length dimension of the body. When the elongate body is formed by the powder in tube method, the reduction of the tube to wire causes sufficient alignment of the first powder portion. However, when the foil wrapping method is used, the elongate body should be reduced at least about 20 percent, for example by rolling or pressing. The elongate body is heated to reaction-sinter the powder mixture, and form the oxide superconductor having the approximate formula $Bi_{2-x}Pb_xSr_{2-a}La_{+b}Ca_{1-b}Cu_2O_y$. The maximum reaction-sintering temperature is below the melting point of the superconducting material, below about 900° C. Preferably, the reaction-sintering temperature ranges from about 1073 K., 800° C., to about 1123 K., 850° C.

The heating can be performed at about atmospheric pressure in an oxidizing atmosphere such as air. Preferably, the elongate body is heated in an atmosphere comprised of about 2 to 100 volume percent oxygen, and the balance an inert atmosphere such as nitrogen or argon. When lead is present in the powder mixture, oxygen partial pressures in the lower part of the range are preferred.

The 2201 compound, and any 2221 compound, in the first portion has an orthorhombic crystal form that is aligned by the deformation of the elongate body so that the longest axis of the crystal, the c-axis, is aligned normal to the length dimension of the body. At the reaction temperature, the aligned first portion of superconducting bismuth oxide compounds, and second portion of oxides reaction-sinter to form the superconducting compound and form conducting links between the grains while maintaining the desired alignment of the grains.

A preheating step to react a portion of the powder mixture, and additional rolling or pressing steps can be performed on the tapes to further align the superconducting bismuth oxide compounds, and consolidate the oxide superconductor before performing the final reaction-sintering heating. For example, a tape can be reduced in cross section about 3 to 10 percent. Pressing or rolling of the elongate body orients the portion of the powder that was reacted to form the superconducting compound. A series of such preheating steps, and pressing or rolling steps can be performed to further align the superconducting bismuth oxide compounds. In the final heating step, the reaction-sintering temperature is maintained until all the oxides present have been consumed to form the oxide superconductor core of the 2212 compound.

The elongate conductor, and method of this invention are further illustrated by the following Example. In the following Example, the superconducting critical current of the core in the elongate conductors was measured by the conventional four probe resistance measurement technique. Briefly described, two voltage probes were soldered on a conductor so they were spaced apart along the length dimension of the conductor. Two current leads were soldered onto the conductor so they were spaced outside of the voltage probes. An increasing current was applied to the current probes at various temperatures while measuring the voltage between the voltage probes. The critical current was defined as the current at which a voltage of 0.5 microvolts was measured.

EXAMPLE 1

A first mixture of powders of bismuth sesquioxide, strontium carbonate, calcium carbonate, and copper oxide in proportions suitable for forming an oxide compound having the approximate formula $Bi_2Sr_{1.5}Ca_{0.5}CuO_{6+y}$, were milled in water with zirconia milling media for about 2 hours. A second mixture comprised of strontium carbonate, calcium carbonate, and copper oxide in ratios suitable for forming an oxide compound having the approximate formula $Sr_{0.5}Ca_{0.5}CuO_2$ was milled in a similar manner. The mixtures were separated from the milling media and dried.

The first mixture was heated at about 100° C. per hour to 825° C., held at 825° C. for 48 hours, and cooled at 100° C. per hour to room temperature. X-ray diffraction analysis showed the reacted first mixture was comprised primarily of the 2201 compound with a small amount of about 10 percent of the 2212 compound. The second mixture was heated at 100° C. per hour to 975° C., held at 975° C. for 48 hours, and cooled at 100° C. per hour to room temperature. X-ray diffraction analysis showed the second mixture reacted to form the oxide compound having the formula $Sr_{0.5}Ca_{0.5}CuO_2$.

A third mixture suitable for forming the oxide compound having the approximate formula $Bi_2Sr_2CaCu_2O_{8+y}$ was formed by mixing about 72.9 grams of the first mixture with 15.94 grams of the second mixture. The third mixture was ball milled with zirconia milling media in heptane, and dried in a nitrogen atmosphere. The third mixture was isostatically pressed at 2461 kilograms per meter squared, and passed through a screen of about −20 mesh. About 3.65 grams of the powder was loaded into a silver tube having an outside diameter of about 6.38 millimeters and an inside diameter of about 4.38 millimeters, and plugged at each end with a silver cap. The tube was swagged and wire drawn to a wire having a diameter of about 0.127 centimeters. The wire was rolled repeatedly to form a tape about 0.025 centimeters thick. Samples about 5 centimeters long were cut from the tape and heated in air at 830° C. for 24 hours. One sample was pressed at about 9843 kilograms per meter squared, and heated in air at 830° C. for 24 hours. The sample was measured to have a critical current of about 28.8 amps at 4.2 K. The sample was repressed at 9843 kilograms per meter squared and reheated to 830° C. in air for 24 hours. The repressed and reheated sample had a critical current of about 24 amps at 4.2 K.

EXAMPLE 2

Another composite elongate conductor was formed by the method in Example 1 except as noted herein. The elongate conductor was formed to have a core of oxide superconductor, having the approximate formula $Bi_2Sr_{1.8}Nd_{0.2}CaCu_2O_{8+y}$. A first mixture was formed having the approximate composition $Bi_2Sr_{1.3}Nd_{0.2}Ca_{0.5}CuO_4$. After heating the first mixture to 825° C. for 8 hours as in Ex. 1, X-ray diffraction analysis showed the reacted first mixture was comprised of about 70 percent of the 2201 compound, and about 30 percent of the 2212 compound. A second mixture was formed having the approximate composition of $Sr_{0.5}Ca_{0.5}CuO_2$. After the first pressing and heating treatment, the tape sample had a critical current of about 30 amps at 4.2 K. After the repressing and reheating, the tape sample had a critical current of about 15 amps at 4.2 K.

In Examples 1 and 2, it is believed the first pressing and heating steps fully reacted the powder mixture to form the 2212 compound. Therefore, during the reheating there was no reaction-sintering of second portion oxides with 2201 compound to repair the damage to the oxide superconductor core from the repressing. As a result, the critical current in the repressed and reheated samples was reduced.

What is claimed is:

1. A method for forming a composite conductor having a silver sheath and a core of an aligned oxide superconductor of the approximate formula $Bi_{2-x}Pb_xSr_{2-a}La_{+b}Ca_{1-b}Cu_2O_y$ where y is from 7.5 to 8.5, x is from 0.0 to 0.5, and L is a lanthanide where if L is yttrium, gadolinium, terbium, dysprosium, holmium, erbium, thulium, ytterbium, and lutetium, a equals zero and b equals 0.0 to 0.3, and where if L is lanthanum, praseodymium, and neodymium, b equals zero and a equals 0.0 to 0.3, comprising the steps in sequence of:

forming a powder mixture comprised of a superconducting bismuth oxide compound having the approximate formula $Bi_{2-x}Pb_xSr_{2-(a+b)}La_aCa_bCuO_y$ where y is from 6.5 to 7.5, and L is a lanthanide where if L is yttrium, gadolinium, terbium, dysprosium, holmium, erbium, thulium, ytterbium, and lutetium, a equals zero and b equals 0.0 to 0.3, and where if L is lanthanum, praseodymium, and neodymium, b equals zero and a equals 0.0 to 0.3, and sufficient calcium copper oxide to react with $Bi_{2-x}Pb_xSr_{2-(a+b)}La_aCa_bCuO_y$ to form $Bi_{2-x}Pb_xSr_{2-a}La_{+b}Ca_{1-b}Cu_2O_y$;

forming a body having a silver sheath and a core of the mixture;

preheating the body to partially react the $Bi_{2-x}Pb_xSr_{2-(a+b)}La_aCa_bCuO_y$ superconducting bismuth oxide compound with the calcium copper oxide to partially form the $Bi_{2-x}Pb_xSr_{2-a}La_{+b}Ca_{1-b}Cu_2O_y$ superconductor;

deforming the body to align the unreacted $Bi_{2-x}Pb_xSr_{2-(a+b)}La_aCa_bCuO_y$ superconducting compound and the $Bi_{2-x}Pb_xSr_{2-a}La_{+b}Ca_{1-b}Cu_2O_y$ superconductor so that the c-axis of the crystals of the unreacted $Bi_{2-x}Pb_xSr_{2-(a+b)}La_aCa_bCuO_y$ superconducting compound and the $Bi_{2-x}Pb_xSr_{2-a}La_{+b}Ca_{1-b}Cu_2O_y$ superconductor crystal, is aligned normal to the length dimension of the body; and thereafter, subsequently reaction-sintering the body until all the unreacted aligned $Bi_{2-x}Pb_xSr_{2-(a+b)}La_aCa_bCuO_y$ and calcium copper oxides present have been consumed to form the aligned $Bi_{2-x}Pb_xSr_{2-a}La_{a+b}Ca_{1-b}Cu_2O_y$ core oxide superconductor.

2. A method according to claim 1 wherein the calcium copper oxide is comprised of a compound having the approximate formula $Ca_{1-(a+b)}Sr_aL_bCuO_y$ where y is from about 2 to 2.5, and L is a lanthanide where if L is yttrium, gadolinium, terbium, dysprosium, holmium, erbium, thulium, ytterbium, and lutetium, a equals zero and b equals 0.0 to 0.3, and where if L is lanthanum, praseodymium, and neodymium, b equals zero and a equals 0.0 to 0.3.

* * * * *